US 8,658,516 B2

(12) United States Patent
Kurita

(10) Patent No.: US 8,658,516 B2
(45) Date of Patent: Feb. 25, 2014

(54) METHOD OF PRODUCING SILICON WAFER, EPITAXIAL WAFER AND SOLID STATE IMAGE SENSOR, AND DEVICE FOR PRODUCING SILICON WAFER

(75) Inventor: Kazunari Kurita, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 13/016,236

(22) Filed: Jan. 28, 2011

(65) Prior Publication Data

US 2011/0189805 A1  Aug. 4, 2011

(30) Foreign Application Priority Data

Jan. 29, 2010 (JP) .................. 2010-018282
Jan. 29, 2010 (JP) .................. 2010-018424
Jan. 29, 2010 (JP) .................. 2010-018434
Jan. 29, 2010 (JP) .................. 2010-018469

(51) Int. Cl.
*H01L 21/322* (2006.01)

(52) U.S. Cl.
USPC ...... 438/473; 438/471; 438/58; 257/E21.318; 257/E21.317

(58) Field of Classification Search
USPC .............. 438/473, 471, 58; 257/E21.317, 257/E21.318
See application file for complete search history.

(56) References Cited

U.S. PATENT DOCUMENTS

| | | | |
|---|---|---|---|
| 6,566,683 B1 * | 5/2003 | Ogawa et al. ................. | 257/53 |
| 2004/0087156 A1 * | 5/2004 | Maekawa ..................... | 438/689 |
| 2005/0045880 A1 * | 3/2005 | Itoh et al. ..................... | 257/52 |
| 2007/0059949 A1 * | 3/2007 | Yamazaki et al. ............ | 438/795 |
| 2007/0169683 A1 * | 7/2007 | Haga et al. ................... | 117/13 |

FOREIGN PATENT DOCUMENTS

| | | | | |
|---|---|---|---|---|
| JP | 2003-264194 | * | 9/2003 | ............ H01L 21/322 |
| JP | 2004-311615 A | | 11/2004 | |
| JP | 2006-019360 | * | 1/2006 | ............ H01L 27/146 |
| JP | 2006-319173 A | | 11/2006 | |
| JP | 2008-108792 | | 5/2008 | |
| KR | 2007-0054568 A | | 5/2007 | |
| KR | 2008-0042690 A | | 5/2008 | |
| KR | 2009-0116647 A | | 11/2009 | |

OTHER PUBLICATIONS

Liu et al., "Laser Ablation and Micormachining with Ultrashort Laser Pulses," IEEE Journal of Quantum Electroncs, vol. 33, 1706-1716, 1997.*

(Continued)

*Primary Examiner* — Julia Slutsker
(74) *Attorney, Agent, or Firm* — Thomas J. Engellenner; Reza Mollaaghababa; Pepper Hamilton LLP

(57) ABSTRACT

An object of the present invention is to provide a method of producing a silicon wafer and a method of producing an epitaxial wafer, which enable easily forming a gettering site in a relatively short period of time and effectively suppressing occurrence of dislocation induced by internal stresses. Specifically, the present invention provides a method of producing a silicon wafer, comprising: irradiating a first laser beam having a relatively long wavelength and a second laser beam having a relatively short wavelength onto a portion of a silicon wafer located at a predetermined depth measured from a surface of the silicon wafer, wherein the first laser beam is concentrated at a portion located at a predetermined depth of the wafer to form a process-affected layer for gettering heavy metals thereat, the second laser beam is concentrated at a beam-concentration portion in the vicinity of the surface of the wafer to melt the beam-concentration portion, the beam-concentration portion is then recrystallized.

11 Claims, 4 Drawing Sheets

(56) References Cited

OTHER PUBLICATIONS

"Science of Silicon," Realize Corporation, pp. 585-590, Jun. 28, 1996.

Korean Office Action issued Dec. 14, 2011 for Korean Application No. 10-2010-0135781 (6 Pages) (Korean Language Reference).

Korean Office Action issued Dec. 14, 2011 for Korean Application No. 10-2010-0135781 (6 Pages).

\* cited by examiner

METHOD OF PRODUCING SILICON WAFER, EPITAXIAL WAFER AND SOLID STATE IMAGE SENSOR, AND DEVICE FOR PRODUCING SILICON WAFER

BACKGROUND OF THE INVENTION

1. Field of the Invention

The present invention relates to a method of producing a silicon wafer and an epitaxial wafer, and in particular to a method of producing a silicon wafer, an epitaxial wafer and a solid state image sensor, as well as a silicon wafer producing device, which enable easily forming a gettering site in a relatively short period of time and effectively suppressing occurrence of internal stress-induced dislocation, by irradiating a silicon wafer with predetermined types of laser beams.

2. Description of the Related Art

In recent years, mobile phones and digital video cameras include a high-performance solid state image sensor using a semiconductor mounted thereon, and hence the performances such as number of pixels and the like thereof have been remarkably improved. Such a consumer solid state image sensor as described above is required to be capable of capturing moving images with a relatively high pixel count and have a miniaturized size. In order to capture moving images in such a manner, it is necessary to combine the solid state image sensor with a high-speed computing element and a memory device, whereby a CMOS image sensor facilitating System-on-chip (SoC) is used and the downsizing of the CMOS image sensor is going on.

A dark leakage current of a photodiode is becoming a problem because it is a factor of deteriorating imaging properties of the solid state image sensor. The main cause of the dark leakage current is heavy metal contamination during processing steps. In order to suppress the heavy metal contamination, it has been generally attempted to form a gettering site for heavy metals at an inside of a semiconductor wafer or at a back surface of the wafer.

As means for forming a gettering site at the inside of a semiconductor wafer, there has been proposed a method (IG method) of subjecting the semiconductor wafer to a heat treatment to form an oxygen precipitate portion within the wafer, as disclosed in "Science of Silicon" edited by a UCS semiconductor substrate technique research institute, Realize Corporation, Jun. 28, 1996, p 585-590. In this method, however, a long-time heat treatment is required for forming the given oxygen precipitation portion, thereby possibly increasing producing cost and causing heavy metal contamination during the heat treatment.

As means for forming the gettering site at the back surface of a semiconductor wafer, there has been proposed a method (PBS method) of forming a polycrystalline silicon film on the back surface of the semiconductor wafer and using the back surface as a gettering site, as disclosed, for example, in "Science of Silicon", edited by a UCS semiconductor substrate technique research institute, Realize Corporation, Jun. 28, 1996, p 585-590. However, when the semiconductor wafer has a large diameter of 300 mm or the like, in particular, it is difficult to form the gettering site on the back surface thereof because such a large-diameter wafer is usually a wafer to be polished on both surfaces thereof.

Further, recently, as a method of forming a gettering site at the inside of a double-side-polished semiconductor wafer such as a large diameter wafer having a diameter of 300 mm or more without necessitating a long-time heat treatment, there has been developed a method, as disclosed for example in Japanese Patent Application Laid-open No. 2008-108792, of irradiating the inside of a silicon semiconductor wafer with a low-output laser beam from a surface of the semiconductor wafer, thereby causing a multiphoton absorption process only at a predetermined depth position of the wafer to form a process-affected layer thereat, and utilizing the process-affected layer as a gettering site.

SUMMARY OF THE INVENTION

However, in a case where a gettering site is formed by using the method disclosed in Japanese Patent Application Laid-open No. 2008-108792, the portion irradiated with laser beam instantly reaches high temperature and thermal impulse is generated in the vicinity thereof, whereby internal stresses are locally exerted and then these internal stresses are alleviated through a thermal process such as device processes. As a result, dislocation develops from the process-affected layer, thereby causing a problem of deterioration of device characteristics.

A problem to be solved by the present invention is to provide a method of producing a silicon wafer, an epitaxial wafer and a solid state image sensor, as well as a device for producing the silicon wafer, which enable easily forming a gettering site in a relatively short period of time and effectively suppressing occurrence of internal stress-induced dislocation, by irradiating a silicon wafer with predetermined types of laser beams.

As a result of keen study by the present inventor to solve the problem above, there has been revealed that it is possible to easily form a gettering site in a relatively short period of time and also effectively suppress occurrence of dislocation induced by internal stresses, by: irradiating a first laser beam having a relatively long wavelength and a second laser beam having a relatively short wavelength onto a portion of a silicon wafer located at a predetermined depth measured from a surface of the silicon wafer, wherein the first laser beam is concentrated at a portion located at a predetermined depth of the wafer to form a process-affected layer for gettering heavy metals thereat, the second laser beam is concentrated at a beam-concentration portion in the vicinity of the surface of the wafer to melt the beam-concentration portion, and the beam-concentration portion is then recrystallized.

In order to achieve the object above, the present invention has the following main configurations.

(1) A method of producing a silicon wafer, comprising irradiating a first laser beam having a relatively long wavelength and a second laser beam having a relatively short wavelength onto a portion of a silicon wafer located at a predetermined depth measured from a surface of the silicon wafer, wherein the first laser beam is concentrated at a portion located at a predetermined depth of the wafer to form a process-affected layer for gettering heavy metals thereat, the second laser beam is concentrated at a beam-concentration portion in the vicinity of the surface of the wafer to melt the beam-concentration portion, the beam-concentration portion is then recrystallized.

(2) The method of producing a silicon wafer according to (1), wherein a wavelength of the first laser beam is in the range of 600 to 1200 nm, and, a wavelength of the second laser beam is in the range of 100 to 500 nm.

(3) The method of producing a silicon wafer according to (2), wherein the first laser beam is an ultrashort pulse laser, and the second laser beam is YLF or YAG laser.

(4) The method of producing a silicon wafer according to (1), wherein energy density of the first laser beam is in the range of $1\times10^{-6}$ to $1\times10^{-3}$ J/pulse, and energy density of the second laser beam is in the range of $1\times10^{-3}$ to $1\times10^{-2}$ J/pulse.

(5) The method of producing a silicon wafer according to (1), wherein the first laser beam is irradiated before irradiation of the second laser beam, or is irradiated at the same time as irradiation of the second laser beam.

(6) The method of producing a silicon wafer according to (5), wherein the second laser beam is irradiated within $1 \times 10^{-6}$ second after the irradiation of the first laser beam.

(7) The method of producing a silicon wafer according to (1), wherein the portion at the predetermined depth at which the first laser beam is concentrated is in the depth range of 1 to 1000 μm measured from the wafer surface.

(8) The method of producing a silicon wafer according to (1), wherein, in the process-affected layer, density of laser irradiation-induced defects observed with an optical microscope after Wright etching applied thereto is in the range of $1.0 \times 10^5$ to $1.0 \times 10^7$ defects/cm$^2$.

(9) The method of producing a silicon wafer according to (1), wherein the first laser beam and the second laser beam are irradiated in a gas atmosphere of nitrogen, argon, hydrogen or mixture thereof.

(10) The method of producing a silicon wafer according to (1), the method further comprising, prior to irradiation of the first laser beam and the second laser beam, pulling up a silicon single crystal ingot at a rate equal to or higher than a predetermined rate, wherein the rate of pulling up the ingot is 0.6 mm/min or higher in a case where the ingot has a diameter of 450 mm or more, and is 0.8 mm/min or higher in a case where the ingot has a diameter of less than 450 mm.

(11) The method of producing a silicon wafer according to (10), wherein, density of crystal defects of the silicon wafer before irradiation of the first laser beam and the second laser beam is in the range of $1 \times 10^3$ to $1 \times 10^5$ defects/cm$^3$.

(12) A method of producing an epitaxial wafer, comprising using as a substrate the silicon wafer produced by the production method according to any one of (1) to (11) above and forming an epitaxial film on the substrate.

(13) A method of producing a solid state image sensor, comprising forming a built-in photodiode on the epitaxial wafer produced by the production method according to (12).

(14) A device for producing a silicon wafer, comprising: laser beam irradiation means for irradiating a first laser beam having a relatively long wavelength and a second laser beam having a relatively short wavelength; and laser beam concentrating means for concentrating the first laser beam at a portion located at a predetermined depth of the wafer and concentrating the second laser beam in the vicinity of the surface of the wafer.

(15) The device for producing a silicon wafer according to (14), wherein the laser beam concentrating means is adapted to split an incoming laser beam into plural beams so as to effect simultaneous irradiation and concentration of the split beams at plural portions of the silicon wafer.

(16) The device for producing a silicon wafer according to (14), wherein a wavelength of the first laser beam is in the range of 600 to 1200 nm, and a wavelength of the second laser beam is in the range of 100 to 500 nm.

(17) The device for producing a silicon wafer according to (16), wherein the first laser beam is an ultrashort pulse laser, and the second laser beam is a YLF laser.

(18) The device for producing a silicon wafer according to (14), wherein energy density of the first laser beam is in the range of $1 \times 10^{-6}$ to $1 \times 10^{-3}$ J/pulse, and energy density of the second laser beam is in a range of $1 \times 10^{-3}$ to $1 \times 10^{-2}$ J/pulse.

According to the present invention, it is possible to provide a method of producing a silicon wafer, an epitaxial wafer and a solid state image sensor, and a device for producing a silicon wafer, which enable easily forming a gettering site in a relatively short period of time and effectively suppressing occurrence of internal stress-induced dislocation.

DESCRIPTION OF THE PREFERRED EMBODIMENT (Method of Producing a Silicon Wafer)

Figure 1:
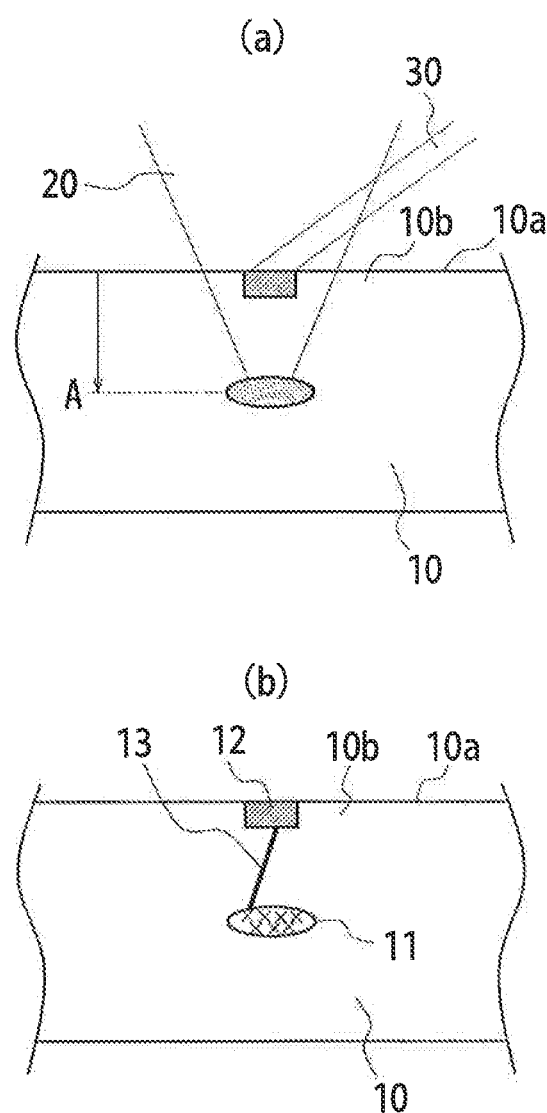
FIG. 1A is a sectional view schematically illustrating a silicon wafer in a state where a laser beam is being irradiated according to a method of producing a silicon wafer of the present invention.
FIG. 1B is a sectional view schematically illustrating a silicon wafer after being irradiated with the laser beam according to the method of producing a silicon wafer of the present invention.

A method of producing a silicon wafer according to the present invention will be described with reference to the drawings. FIGS. 1A and 1B are schematic views illustrating states of a silicon wafer before and after irradiation of laser beams on the silicon wafer by the method of producing a silicon wafer according to the present invention.

As illustrated in FIG. 1A, the method of producing a silicon wafer according to the present invention includes a step of irradiating a first laser beam 20 having a relatively long wavelength and a second laser beam 30 having a relatively short wavelength onto a portion located at a predetermined depth measured from a surface 10a of a silicon wafer 10. The first laser beam 20 is concentrated at a portion located at a predetermined depth A of the wafer 10 to form a process-affected layer 11 for gettering heavy metals, and the second laser beam 30 is concentrated at a beam-concentration portion in the vicinity of the surface 10a (a surface layer portion 10b) of the wafer to melt the beam-concentration portion. The beam-concentration portion is then recrystallized.

With the device configuration described above, the process-affected layer 11 as a gettering site can be easily formed in a relatively short time by using the first laser beam 20, and dislocation 13 induced by occurrence of internal stresses generated as a result of irradiation of the first laser beams 20 can be effectively suppressed in a region 12 (FIG. 1B) melted by irradiation of the second laser beam 30 and then recrystallized, whereby a high-quality device region can be obtained.

Figure 3:
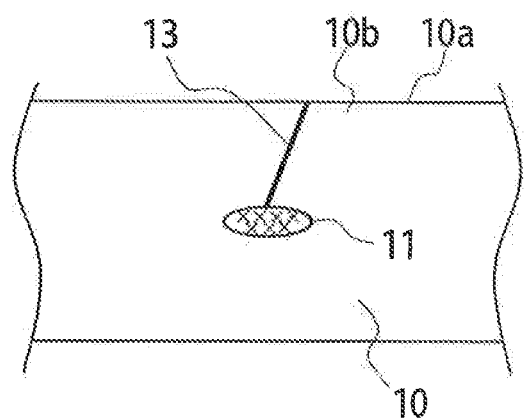
FIG. 3 is a sectional view schematically illustrating a silicon wafer after being irradiated with laser beam according to a conventional method of producing a silicon wafer.

As illustrated in FIG. 3, in a case where the process-affected layer 11 is formed by irradiation of the conventional laser beam, the dislocation 13 caused by internal stresses occurring due to formation of the process-affected layer 11 reaches the silicon wafer surface 10a or in the vicinity thereof, and as a result, the device characteristics may deteriorate.

It should be noted that the process-affected layer 11 represents an affected or altered layer generated as a result of: a multiphoton absorption process which occurs due to irradiation of the first laser beam 20 onto a part of the silicon wafer 10 and melts a region in the vicinity of the portion where the first laser beam 20 has been focused; and recrystallization of the region thereafter. This process-affected layer 11 functions as a gettering sink for capturing the heavy metals.

Further, density of laser irradiation-induced defects of the process-affected layer 11, observed with an optical microscope after the process-affected layer 11 is subjected to Wright etching, is preferably in the range of $1.0\times10^5$ to $1.0\times10^7$ defects/$cm^2$. In a case where the density of the laser irradiation-induced defects is less than $1.0\times10^5$ defects/$cm^2$, there is a possibility that the process-affected layer 11 does not sufficiently function as the gettering site. In a case where the density of the laser irradiation-induced defects exceeds $1.0\times10^7$ defects/$cm^2$, the density of the laser irradiation-induced defects is too high, whereby the resulting defects may adversely affect the device characteristics. In the present invention, "Wright etching" represents a chemical etching with a chromic acid solution.

The first laser beam 20 represents a laser beam having a wavelength longer than that of the second laser beam 30. By using laser having a relatively long wavelength, the laser beam can be concentrated at a predetermined depth position A of the silicon wafer 10 such that the multiphoton absorption process occurs and thus the process-affected layer 11 is formed at the depth position. In the present embodiment, a "relatively long wavelength" represents a wavelength of laser beam that can transmit through a silicon single crystal having a thickness of 1000 μm or less. More specifically, a "relatively long wavelength" is preferably in the range of 600 to 1200 nm. In a case where the relatively long wavelength is less than 600 nm, the wavelength is too short and there is a possibility that the laser beam fails to reach the predetermined depth position A or a possibility that the laser beam affects the surface layer portion 10b of the silicon waver 10. In a case where the relatively long wavelength exceeds 1200 nm, the wavelength is too long and there is a possibility that the process-affected layer 11 is not formed by irradiation of the laser beam.

More specifically, the first laser is preferably an ultrashort pulse laser. This is because the ultrashort pulse laser, having a wavelength of 1000 nm or more, exhibits high transmission property and is capable of forming the process-affected layer 11 without affecting the crystal structure of the surface layer portion 10b of the silicon wafer 10. Further, the ultrashort pulse laser is operable at low electric power and is capable of being concentrated at any position in the silicon single crystal or the silicon wafer with an optical system.

Depending on applications, a light-concentrating means such as a light-concentrating lens (not shown) can be employed so as to concentrate the first laser beam 20 at a predetermined depth position of the silicon wafer 10. By adjusting the light-concentrating means, it is possible to adjust the first laser beam 20 such that the first laser beam 20 concentrates at a desired depth position A, without changing the mission source.

The predetermined depth position A at which the first laser beam 20 is concentrated is located preferably in the depth range of 1 to 1000 μm measured from the wafer surface 10a. In a case where the depth position A is less than 1 μm measured from the wafer surface, the position is too close to the surface 10a of the silicon wafer, possibly resulting in damage to the surface by irradiation of the laser beam. In a case where the depth position A exceeds 1000 μm measured from the silicon surface, the position is too distanced from the surface layer portion 10b of the silicon wafer 10, possibly deteriorating the gettering effect.

Further, energy density of the first laser beam 20 is preferably in the range of $1\times10^{-6}$ to $1\times10^{-3}$ J/pulse. In a case where the energy density is less than $1\times10^{-6}$ J/pulse, the energy is too low, possibly resulting in insufficient formation of the process-affected layer 11. In a case where the energy density exceeds $1\times10^{-3}$ J/pulse, the energy is too high, possibly resulting in excessive light absorption in the vicinity of the surface of the wafer and a situation in which the laser beam 20 fails to reach the predetermined depth position A.

A period of time during which the first laser beam 20 is irradiated is preferably in the range of $1\times10^{-12}$ to $1\times10^{-6}$ sec, although the period of time may vary depending on the magnitude of wavelength or energy density of the laser beam 20. In a case where the irradiation period is less than $1\times10^{-12}$ sec, the irradiation period is too short, whereby the process-affected layer 11 may not be sufficiently formed. In a case where the irradiation period exceeds $1\times10^{-6}$ sec, the irradiation period is too long, whereby excessive damages may be formed in silicon single crystal, causing dislocation to occur.

The second laser beam 30 represents a laser beam having a wavelength shorter than that of the first laser beam 20. By using laser having a relatively shorter wavelength, the laser beam can be concentrated at a beam-concentration portion in the vicinity of the surface of the silicon wafer 10 (i.e. surface layer portion 10b) such that the beam-concentration portion is melted. The beam-concentration portion thus melted is then recrystallized. In the present embodiment, a "relatively short wavelength" represents a wavelength of 500 μm or less. More specifically, a "relatively short wavelength" is preferably in the range of 100 to 500 nm. In a case where the relatively short wavelength is less than 100 nm, the wavelength is too short and there is a possibility that absorption of light energy at the outermost surface layer of the silicon wafer 10 is too strong, causing excessive damage to the surface layer portion 10b. In a case where the wavelength exceeds 500 nm, the wavelength is too long and there is a possibility that the surface portion 10b of the silicon wafer 10 may not be melted by irradiation of the laser beam in a satisfactory manner, resulting in unsatisfactory recrystallization.

In the present embodiment, the "surface layer portion 10b" of the silicon wafer 10 represents a portion of the wafer extending from the surface 10a of the silicon wafer 10 up to a predetermined depth portion, which portion is needed as a device layer. The surface layer portion 10b is preferably a portion of the wafer extending from the surface 10a of the silicon wafer 10 up to the depth position in the range of about 0.2 to 2 μm. In a case where the depth of the surface layer portion 10b is less than 0.2 μm measured from the wafer surface, the surface layer portion is too thin and there is a possibility that a desired device layer cannot be obtained. In a case where the depth of the surface layer portion 10b exceeds 2 μm measured from the wafer surface, the energy required for melting the surface layer portion 10b is too large, possibly causing damages on the wafer surface 10a.

The density of crystal defects of the silicon wafer 10 prior to the irradiation of the first laser beam and the second laser beam is preferably in the range of $1\times10^3$ to $1\times10^5$ defects/$cm^3$. In a case where the density of the crystal defects is less than $1\times10^3$ defects/$cm^3$, the silicon wafer can be used as it is as a product and may not fully enjoy an effect of repairing crystal defects of the present invention. In a case where the density of the crystal defects exceeds $1\times10^5$ defects/$cm^3$, the density of the crystal defects are so high that crystal defects may not be sufficiently repaired by irradiation of the second laser beam 30.

The type of the second laser beam is not particularly limited, provided that the second laser beam meets the above-described size and shape requirements. Regarding specific types of the second laser beam, a pulse laser such as an excimer laser is preferable and YLF or YAG laser is more preferable for use. YLF and YAG lasers are preferable because they are both semiconductor lasers capable of utilizing optical pumping, and economical due to a possible smaller size of a laser device body thereof.

Depending on applications, a light-concentrating means such as a light-concentrating lens (not shown) can be employed so as to concentrate the second laser beam 30 on the surface layer portion 10b of the silicon wafer 10. By adjusting the light-concentrating means, it is possible to adjust the second laser beam 30 such that the second laser beam 30 concentrates at a desired depth position, without changing the emission source.

Further, energy density of the second laser beam 30 is preferably in the range of $1 \times 10^{-3}$ to $1 \times 10^{-2}$ J/pulse. In a case where the energy density is less than $1 \times 10^{-3}$ J/pulse, the energy is too low, whereby the surface layer portion 10b of the silicon wafer 10 may not sufficiently melt. In a case where the energy density exceeds $1 \times 10^{-2}$ J/pulse, the energy is too high, causing excessive damage to the beam-concentration portion, whereby dislocation may significantly occur in the surface layer portion 10b of the silicon wafer 10.

Yet further, the irradiation of the first laser beam 20 is carried out either prior to irradiation of the second laser beam 30 or concurrently with irradiation of the second laser beam 30. By melting the surface layer 10b of the silicon wafer with the second laser beam 30 and allowing the melted portion to recrystallize thereafter, it is possible to prevent dislocation, induced by internal stresses exerted as a result of formation of the process-affected layer 11, from extending to the surface layer portion 10b. If the second laser beam 30 is irradiated before the first laser beam 20, there is a possibility that dislocation 13 generated within the silicon wafer 10 by irradiation of the first laser beam 20 thereafter may reach a region 12 which has already been recrystallized.

Yet further, irradiation of the second laser beam 30 is preferably carried out within $1 \times 10^{-6}$ sec after irradiation of the first laser beam 20. In a case where the interval between the two laser irradiations exceeds $1 \times 10^{-6}$ sec, the interval is too long, possibly reducing throughput.

The irradiation period of the second laser beam 30 is preferably in the range of $1 \times 10^{-9}$ to $1 \times 10^{-6}$ sec, although the irradiation period may vary depending on wavelengths or magnitude of the energy density of the laser beam 30. In a case where the irradiation period of time is less than $1 \times 10^{-9}$ sec, the irradiation period is too short to cause the surface layer portion 10b to sufficiently melt (recrystallization thereafter is naturally not satisfactory, either). In a case where the irradiation period of time exceeds $1 \times 10^{-6}$ sec, the irradiation period is too long, possibly causing damages to the surface layer portion 10b of the silicon wafer.

Figure 4:
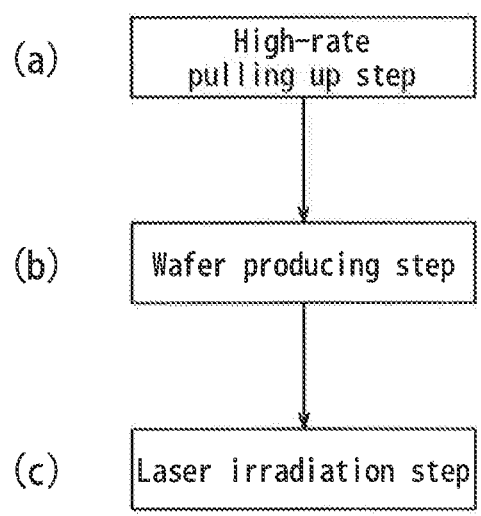
FIG. 4 is a flow diagram of the method of producing a silicon wafer according to the present invention.

Further, as illustrated in FIGS. 4A through 4C, it is preferable that the method of producing a silicon wafer of the present invention further includes a high-rate pulling-up step of pulling up a silicon single crystal ingot at a rate equal to or higher than a predetermined rate (the step (a) of FIG. 4) prior to a step of irradiating the first laser beam and the second laser beam (FIG. 4C). Pulling up the silicon single crystal ingot at a relatively high rate makes it possible to produce a silicon wafer in a shorter period of time than by the conventional method. Further, in the present invention, the process-affected layer 11 serving as a gettering site can be easily formed in a relatively short period of time by using the first laser beam 20. Yet further, crystal defects (not shown) generated in the wafer 10 as a result of the high-rate pulling-up step can be repaired by melting the region 12 and allowing the region to recrystallize by irradiation of the second laser beam 30 (FIG. 1B), so that occurrence of dislocation 13 induced by the internal stresses generated as a result of irradiation of the first laser beam 20 can be effectively suppressed. Accordingly, a high-quality device region can be obtained.

The high-rate pulling-up step (the step(a) of FIG. 4) represents a step of pulling up a silicon single crystal ingot at a rate equal to or higher than a predetermined rate by using a CZ method (Czochralski method). It is possible to produce a large amount of silicon wafers in a shorter period of time, by pulling up the silicon single crystal ingot at a rate higher than the conventional pulling-up rate. Further, as illustrated in FIG. 4, after the high-rate pulling-up step (the step (a) of FIG. 4), the pulled-up silicon single crystal ingot is cut and then subjected to various processes (such as grinding and polishing), i.e. a wafer producing step is carried out (the step (b) of FIG. 4), to obtain the silicon wafer 10.

The predetermined pulling-up rate varies depending on a radius of the silicon single crystal ingot and the like. The predetermined pulling-up rate is preferably 0.6 mm/min or higher in a case where the ingot has a diameter of 450 mm or more, while 0.8 mm/min or higher in a case where the ingot has a diameter of less than 450 mm. In a case where the ingot has a diameter of 450 mm or more and is pulled up at a rate of less than 0.6 mm/min, or in a case where the ingot has a diameter of less than 450 mm and is pulled up at a rate of less than 0.8 mm/min, the pulling-up rate is too slow, whereby the silicon wafer cannot be produced in a short period of time and the good effect of the present invention may not be fully demonstrated. In a case where the ingot has a diameter of 450 mm or more and is pulled up at an excessively high rate, defects generated in the wafer 10 significantly increase and there is a possibility that the second laser beam 30 cannot sufficiently repair these defects. Therefore, it is more preferable that the upper limit of the pulling-up rate is set at 0.8 mm/min.

Figure 2:
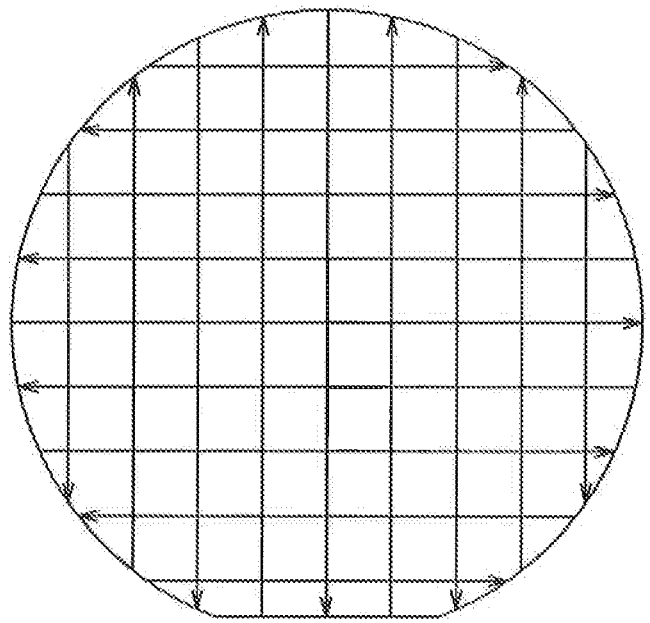
FIG. 2 is a diagram illustrating scanning directions of the laser beam to be irradiated on the silicon wafer, as viewed from the laser-beam irradiation side.

The methods of irradiating the first laser beam 20 and the second laser beam 30 are not specifically limited, as long as the methods meet the above-described conditions. It is acceptable that, as illustrated in FIG. 2, the laser beams 20, 30 are irradiated while conducting scanning. Since respective irradiation areas of the laser beams 20, 30 are relatively small, scanning the laser beams 20, 30 is advantageous technically to efficiently obtain as many devices as possible.

Note that the arrows in the silicon wafer 10 indicate directions in which the laser beams 20, 30 are scanned, respectively. It is possible to set the respective arrows at any intervals, that is, to perform scanning at any pitches, so that the laser beams 20, 30 can be irradiated on a part of or the entire region inside the silicon wafer.

Yet further, a device for generating each of the first laser beam 20 and the second laser beam 30 is not specifically limited, provided that the device can effectively generate the laser beams 20, 30. A conventional device may be used.

Yet further, irradiation of the first laser beam 20 and the second laser beam 30 is preferably carried out in a gas atmosphere of nitrogen, argon, hydrogen or mixture thereof. In a case where irradiation of the first laser beam 20 and the second laser beam 30 is carried out in the atmosphere described above, it is possible to prevent particles and the like existing in the laser irradiation device from being adsorbed onto the surface 10a of the silicon wafer 10.

(Method of Producing an Epitaxial Wafer)

By using as a substrate the silicon wafer 10 produced by the production method of the present invention and forming an epitaxial film on the substrate, it is possible to produce an epitaxial wafer having a gettering layer formed immediately below the epitaxial film.

(Method of Producing a Solid State Image Sensor)

Further, a solid state image sensor can be produced by forming any built-in photodiode on the epitaxial wafer. In the solid state image sensor produced by the method described above, the process-affected layer 11 functions as a gettering site to reduce contamination with heavy metals; and dislocation does not develop to the device region. Accordingly, it is possible to obtain a high-performance photodiode in which deterioration in device characteristics is suppressed.

(Device for Producing a Silicon Wafer)

Figure 5:
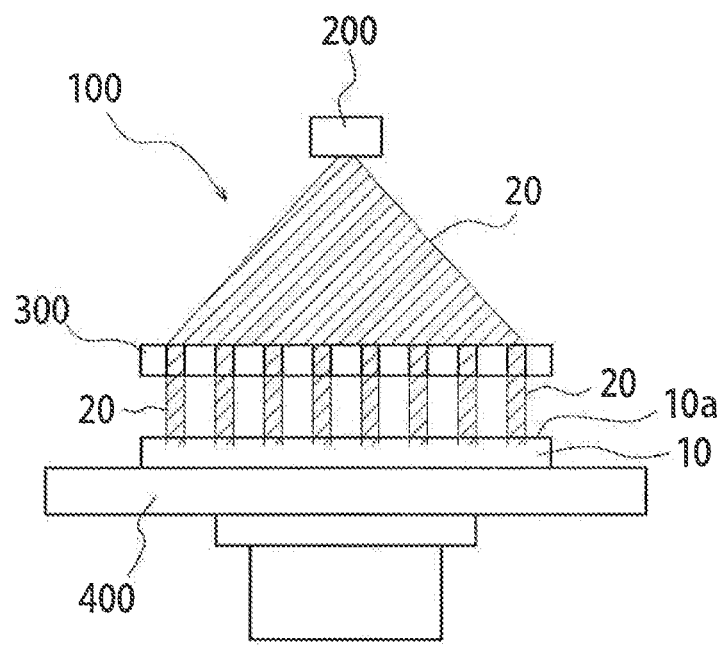
FIG. 5 is a diagram illustrating a state where a device for producing a silicon wafer according to the present invention is irradiating first laser beam.

Next, a device for producing a silicon wafer according to the present invention will be described with reference to the drawings. FIG. 5 illustrates a state where the device for producing a silicon wafer according to the present invention irradiates a laser beam (first laser beam). Further, FIGS. 1A and 1B are schematic views respectively illustrating states of silicon wafers before and after irradiation of laser beams by the device for producing the silicon wafer of the present invention.

As illustrated in FIG. 5, the device 100 for producing a silicon wafer according to the present invention has laser beam irradiation means 200 for irradiating the first laser beam 20 having a relatively long wavelength and the second laser beam 30 having a relatively short wavelength to a predetermined depth portion measured from the surface 10a of the silicon wafer 10, and laser beam concentrating means 300 for concentrating the first laser beam 20 at a portion at a predetermined depth position in the wafer 10 and concentrating the second laser beam 30 in the vicinity of the surface 10a of the wafer 10.

With the configuration described above, as illustrated in FIG. 1A and FIG. 1B, it is possible to: concentrate the first laser beam 20, upon irradiation thereof, at a portion at a predetermined depth position A of the wafer 10 so that the process-affected layer 11 serving as a gettering site for capturing the heavy metals can be easily formed in a relatively short period of time (FIG. 1A); concentrate the second laser beam 30, upon irradiation thereof, in the vicinity of the surface 10a of the wafer, i.e. the surface layer portion 10b, to melt the beam-concentration portion; to allow the melted portion to recrystallize; and effectively suppress by the region 12 thus melted and recrystrallized occurrence of dislocation 13 induced by the internal stresses generated as a result of irradiation of the first laser beam 20 (FIG. 1B). Accordingly, it is possible to obtain a high-quality device region.

As illustrated in FIG. 5, the laser beam irradiation means 200 is means for irradiating the first laser beam 20 having a relatively long wavelength and the second laser beam 30 having a relatively short wavelength. The type of the laser beam irradiation means 200 is not specifically limited, provided that the means 200 can irradiate beams having a relatively long wavelength and a relatively short wavelength, and a laser generation means which is commonly used can be employed. Further, regarding irradiation of the first and second laser beams 20, 30 by the laser beam irradiation means 200, irradiation of the first laser beam 20 and that of the second laser beam 30 may be done either by one single laser beam irradiation means 200 as illustrated in FIG. 5 or separately by different laser beam irradiation means 200, 200.

As illustrated in FIG. 5, the laser beam concentrating means 300 is means for concentrating the first laser beam 20 at a portion located at a predetermined depth position of the wafer 10, and further, although not shown, concentrating the second laser beam 30 in the vicinity of the surface 10a of the wafer 10. Further, regarding concentration of the first and second laser beams 20, by the laser beam concentrating means 300, concentration of the first laser beam 20 and that of the second laser beam 30 may be done either by one single laser beam concentrating means 300 as illustrated in FIG. 5 or separately by different laser beam concentrating means 300, 300.

Figure 6:
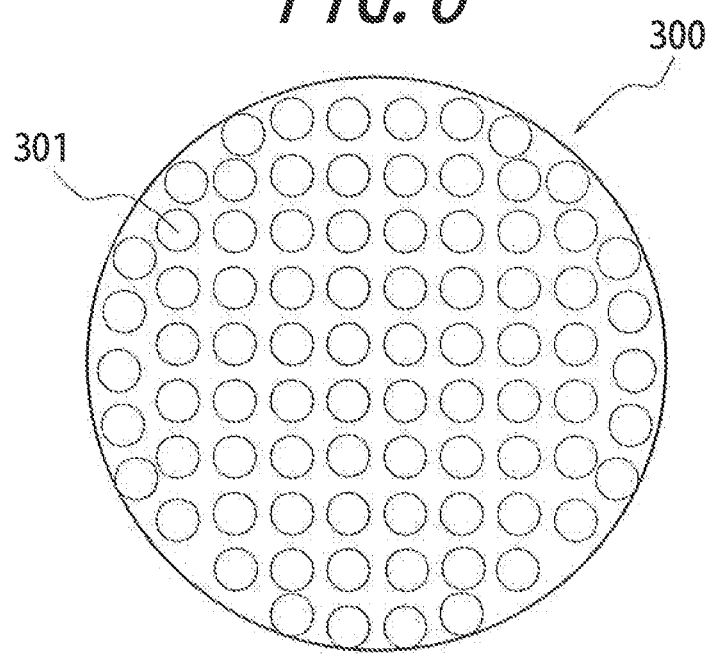
FIG. 6 is a diagram illustrating one embodiment of laser beam concentrating means according to the present invention.

Further, as illustrated in FIG. 5, it is preferable that the laser beam concentrating means 300 splits an incoming laser beam 20 into plural beams so as to irradiate and concentrate the split laser beams onto plural portions of the silicon wafer 10 simultaneously, This is preferable because the silicon wafer 10 can be efficiently produced by irradiating the laser beams 20, 30 onto the plural portions of the silicon wafer 10 simultaneously. The aspects of the concentrating means 300 as described above are not particularly restricted, provided that the laser beams 20 can be irradiated onto and concentrated at the plural portions of the silicon wafer 10 at the same time and, for example, it is possible to employ laser beam concentrating means 300 having plural predetermined laser diodes 301 embedded therein, as illustrated in FIG. 6. Note that the dimensions of portions where the laser beams 20, 30 transmit through (laser diodes 301 in FIG. 6), relative to the dimension of the laser beam concentrating means 300 are illustrated larger than actual dimensions in FIGS. 5 and 6, simply for convenience in explanation.

Other configurations of the device 100 for producing a silicon wafer according to the present invention are not specifically limited, provided that the device 100 includes at least the laser beam irradiation means 200 and the laser beam concentrating means 300 as described above. The device 100 may include a table 400 generally used for mounting the silicon wafer 10 thereon, and the like, as illustrated in FIG. 5.

It should be noted that the foregoing descriptions is merely one example of embodiments of the present invention, and various modifications can be made to the accompanying claims.

EXAMPLES

Example 1

In Example 1, a sample of a silicon wafer 10 was prepared by: using a silicon wafer having a wafer diameter of 200 mm and a thickness of 725 μm; irradiating the first laser beam 20 having a relatively longer wavelength for forming a process-affected layer 11 for capturing the heavy metals, as illustrated in FIG. 1A; irradiating the second laser beam 30 having a relatively shorter wavelength for melting a surface layer portion 10b of the silicon wafer 10; and allowing the melted portion to recrystallize.

Table 1 shows conditions in Example 1 of: a wavelength (nm), energy density (J/pulse), and a depth position (μm) at which beam was concentrated, of the first laser beam 20; a wavelength (nm), energy density (J/pulse), and a depth position (μm) at which beam was concentrated, of the second laser beam 30; and gas atmosphere during laser beam irradiation.

Example 2

In Example 2, a sample of a silicon wafer was prepared under the same conditions as the sample in Example 1, except that the first laser beam 20 and the second laser beam 30 were irradiated at the same time.

Table 1 shows conditions in Example 2 of: a wavelength (nm), energy density (J/pulse), and a depth position (μm) at which beam was concentrated, of the first laser beam 20; a wavelength (nm), energy density (J/pulse), and a depth position (μm) at which beam was concentrated, of the second laser beam 30; and gas atmosphere during laser beam irradiation.

Example 3

In Example 3, a sample of an epitaxial wafer was prepared by using as a substrate the silicon wafer obtained in Example 1 and forming an epitaxial film (film thickness: 4 μm) on the substrate.

Table 1 shows conditions in Example 3 of: a wavelength (nm), energy density (J/pulse), and a depth position (μm) at which beam was concentrated, of the first laser beam 20; a wavelength (nm), energy density (J/pulse), and a depth position (μm) at which beam was concentrated, of the second laser beam 30; and gas atmosphere during laser beam irradiation.

Comparative Example 1

In Comparative Example 1, a sample of a silicon wafer was prepared under the same condition as the sample in Example 1, except that the second laser beam 30 was not irradiated.

Table 1 shows conditions in Comparative Example 1 of: a wavelength (nm), energy density (J/pulse), and a depth position (μm) at which beam was concentrated, of the first laser beam 20; and gas atmosphere during laser beam irradiation.

Comparative Example 2

In Comparative Example 2, a sample of a silicon wafer was prepared under the same condition as the sample in Example 1, except that the first laser beam 20 was not irradiated.

Table 1 shows conditions in Comparative Example 2 of: a wavelength (nm), energy density (J/pulse), and a depth position (μm) at which beam was concentrated, of the second laser beam 30; and gas atmosphere during laser beam irradiation.

(Evaluation Method)

Evaluation was made in terms of the evaluation items (1) and (2) below for each of the silicon wafers and the epitaxial wafer obtained by Examples and Comparative Examples.

(1) Dislocation Density

Dislocation density (number of dislocations/cm$^3$) existing from a surface of a silicon wafer up to a depth of 1 μm is measured at given 20 sites in the silicon wafer by using a TEM (transmission electron microscope) for each of the samples of Examples and Comparative Examples. Observed results are evaluated according to following criteria. The evaluation results are shown in Table 1.

◯: Dislocations density is 1000 dislocations/cm$^3$ or lower
X: Dislocations density exceeds 1000 dislocations/cm$^3$ (2) Gettering Performance Density of etch pits (number of pits/cm$^2$) is measured for each of the samples of Examples and Comparative Examples by: washing the sample with a mixed solution of ammonia water and hydrogen peroxide water and a mixed solution of hydrochloric acid and hydrogen peroxide water; contaminating a surface of the sample with nickel of about 1.0×10$^{12}$ atoms/cm$^2$ by a spin coating contamination method; subjecting the sample to a diffusion heat treatment in a nitrogen atmosphere at a temperature of 1000° C. for one hour in a vertical heat treatment furnace; then etching the surface of the sample with a Wright solution (48% HF: 30 ml, 69% HNO$_3$: 30 ml, 1 g of CrO3+2 ml of H$_2$O, acetic acid: 60 ml); and counting the number of the etch pits (pits formed by etching of nickel silicide) on the surface of the sample by an optical microscope. The detection limit of etch pit density according to this method is 1.0×10$^3$ pits/cm$^2$. Observation results are evaluated according to following criteria. The evaluation results are shown in Table 1.

⊚: Etch pit density is 1.0×10$^3$ pits/cm$^2$ or less (equal to or less than the detection limit)
◯: Etch pit density exceeds 1.0×10$^3$ pits/cm$^2$ and is less than 1.0×10$^5$ pits/cm$^2$
X: Etch pit density is 1.0×10$^5$ pits/cm$^2$ or more

TABLE 1

| | Condition of first laser beam | | | Condition of second laser beam | | | | Evaluation | |
|---|---|---|---|---|---|---|---|---|---|
| | Wavelength (nm) | Energy density (J/pulse) | Depth at which beam is concentrated (μm) | Wavelength (nm) | Energy density (J/pulse) | Depth at which beam is concentrated (μm) | Gas atmosphere | Dislocation density | Gettering performance |
| Example 1 | 1060 | 2 × 10$^{-6}$ | 10 | 300 | 1 × 10$^{-3}$ | 5 | Nitrogen | ◯ | ⊚ |
| Example 2 | 1060 | 2 × 10$^{-6}$ | 10 | 300 | 1 × 10$^{-3}$ | 5 | Nitrogen | ◯ | ⊚ |
| Example 3 | 1060 | 2 × 10$^{-6}$ | 10 | 300 | 1 × 10$^{-3}$ | 5 | Nitrogen | ◯ | ⊚ |
| Comparative Example 1 | 1060 | 2 × 10$^{-6}$ | 10 | | | | Nitrogen | X | ◯ |
| Comparative Example 2 | | | | 300 | 1 × 10$^{-3}$ | 5 | Nitrogen | ◯ | X |

From the results shown in Table 1, it is understood that the silicon wafers of Examples 1 and 2 and the epitaxial wafer of Example 3 each exhibit relatively high gettering performance due to an effect caused by formation of the process-affected layer, as well as relatively low dislocation density, which indicates good suppression of dislocation induced by irradiation of the first laser beam. In contrast, the sample of Comparative Example 1 exhibits dislocation generated at the surface layer portion of the silicon wafer due to formation of the process-affected layer, although the sample has relatively high gettering performance. Further, it is understood that the sample of Comparative Example 2 has relatively low gettering performance because the process-affected layer is not formed therein.

INDUSTRIAL APPLICABILITY

According to the present invention, it is possible to provide a method of producing a silicon wafer, an epitaxial wafer and a solid state image sensor, as well as a device for producing the silicon wafer, which enable easily forming a gettering site in a relatively short period of time and effectively suppressing occurrence of dislocation induced by internal stresses.

What is claimed is:

1. A method of producing a silicon wafer, comprising:
   irradiating a first laser beam onto an inner portion of a silicon wafer located at a predetermined depth measured from a surface of the silicon wafer to form a gettering site within the wafer for capturing heavy metals; and
   irradiating a second laser beam onto a beam-concentration portion that is above the gettering site and extends from the surface of the silicon wafer only partway to the gettering site to melt the beam-concentration portion;
   wherein a wavelength of the first laser beam is in a range of about 600 nm to about 1200 nm, and a wavelength of the second laser beam is in a range of about 100 nm to about 500 nm;
   wherein the energy density of the first laser beam is in a range of about $1\times10^{-6}$ J/pulse to about $1\times10^{-3}$ J/pulse, and an energy density of the second laser beam is in a range of about $1\times10^{-6}$ J/pulse to about $1\times10^{-2}$ J/pulse; and
   wherein the predetermined depth of the inner portion at which the first laser beam is concentrated is in a range of about 1 μm to about 1000 μm measured from the surface of the silicon wafer.

2. The method recited in claim 1, wherein the first laser beam is irradiated before irradiation of the second laser beam, or is irradiated at the same time as irradiation of the second laser beam.

3. The method recited in claim 2, wherein the second laser beam is irradiated within $1\times10^{-6}$ seconds after the irradiation of the first laser beam.

4. The method of producing a silicon wafer of claim 1, wherein the melted beam-concentration portion is then recrystallized.

5. The method of producing a silicon wafer of claim 1, wherein the first laser beam is an ultrashort pulse laser, and the second laser beam is a YLF or YAG laser.

6. The method of producing a silicon wafer of claim 1, wherein, in the portion of the silicon wafer irradiated by the first laser, a density of laser irradiation-induced defects observed with an optical microscope after Wright etching applied thereto is in a range of about of $1.0\times10^5$ to about $1.0\times10^7$ defects/cm$^2$.

7. The method of producing a silicon wafer of claim 1, wherein the first laser beam and the second laser beam are irradiated in a gas atmosphere of nitrogen, argon, hydrogen or mixture thereof.

8. The method of producing a silicon wafer of claim 1, the method further comprising, prior to irradiation of the first laser beam and the second laser beam, pulling up a silicon single crystal ingot at a rate of 0.6 mm/min or higher in a case where the ingot has a diameter of 450 mm or more, or at a rate of 0.8 mm/min or higher in a case where the ingot has a diameter of less than 450 mm.

9. The method of producing a silicon wafer of claim 8, wherein, a density of crystal defects of the silicon wafer before irradiation of the first laser beam and the second laser beam is in a range of about $1\times10^3$ to $1\times10^5$ defects/cm$^3$.

10. A method of producing an epitaxial wafer, comprising using as a substrate the silicon wafer produced by the production method of any of claims 1, 2, 3, 4, 5, and 6-9 and forming an epitaxial film on the substrate.

11. A method of producing a solid state image sensor, comprising forming a built-in photodiode on the epitaxial wafer produced by the production method of claim 10.

* * * * *